United States Patent
Jang et al.

(10) Patent No.: US 11,515,348 B2
(45) Date of Patent: Nov. 29, 2022

(54) IMAGE SENSOR

(71) Applicant: SAMSUNG ELECTRONICS CO., LTD., Suwon-si (KR)

(72) Inventors: Minho Jang, Suwon-si (KR); Jeongsoon Kang, Gumi-si (KR); Taehyoung Kim, Suwon-si (KR); Masaru Ishii, Hwaseong-si (KR); In Sung Joe, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 106 days.

(21) Appl. No.: 16/900,076

(22) Filed: Jun. 12, 2020

(65) Prior Publication Data

US 2021/0134869 A1    May 6, 2021

(30) Foreign Application Priority Data

Nov. 6, 2019 (KR) .................. 10-2019-0141202

(51) Int. Cl.
*H01L 27/146* (2006.01)

(52) U.S. Cl.
CPC .... *H01L 27/14627* (2013.01); *H01L 27/1463* (2013.01); *H01L 27/14623* (2013.01); *H01L 27/14685* (2013.01); *H01L 27/14621* (2013.01)

(58) Field of Classification Search
None
See application file for complete search history.

(56) References Cited

U.S. PATENT DOCUMENTS

| | | | |
|---|---|---|---|
| 7,768,088 B2 | 8/2010 | Fukunaga | |
| 8,890,221 B2 | 11/2014 | Lenchenkov et al. | |
| 9,041,081 B2 | 5/2015 | Lenchenkov | |
| 9,515,120 B2 | 12/2016 | Um et al. | |
| 9,640,577 B2 | 5/2017 | Oh et al. | |
| 9,887,217 B2 | 2/2018 | Ahn et al. | |
| 9,966,407 B2 | 5/2018 | Kim et al. | |
| 10,014,333 B2 | 7/2018 | Velichko et al. | |
| 10,134,791 B1 | 11/2018 | Chen et al. | |
| 10,192,917 B2 | 1/2019 | Francois et al. | |
| 10,944,943 B2* | 3/2021 | Kim | H04N 5/3741 |
| 2016/0049429 A1 | 2/2016 | Lee et al. | |
| 2016/0056199 A1* | 2/2016 | Kim | H01L 27/1463 |
| | | | 257/233 |
| 2016/0111461 A1* | 4/2016 | Ahn | H04N 5/353 |
| | | | 257/225 |
| 2021/0202581 A1* | 7/2021 | Joei | H01L 27/088 |

\* cited by examiner

*Primary Examiner* — Ali Naraghi
(74) *Attorney, Agent, or Firm* — F. Chau & Associates, LLC

(57) ABSTRACT

An image sensor includes a substrate having a first surface, a charge storage portion disposed in the substrate, a light-blocking pattern disposed on the first surface overlapping the charge storage portion, and a low-refractive index pattern on the light-blocking pattern.

20 Claims, 18 Drawing Sheets

US 11,515,348 B2

IMAGE SENSOR

CROSS-REFERENCE TO RELATED APPLICATION

This U.S. non-provisional patent application claims priority under 35 U.S.C. § 119 to Korean Patent Application No. 10-2019-0141202, filed on Nov. 6, 2019, in the Korean Intellectual Property Office, the disclosure of which is hereby incorporated by reference in its entirety.

TECHNICAL FIELD

Embodiments of the present disclosure relate to an image sensor and, more particularly, to a complementary metal-oxide-semiconductor (CMOS) image sensor.

DISCUSSION OF RELATED ART

An image sensor is a device for converting an optical image into electrical signals. The image sensor may be used in a digital camera or other image processing devices. The image sensor may include a plurality of pixels. A mechanical shutter method or an electrical shutter method may be used to adjust an exposure time influencing the number of captured photocharges corresponding to a basis of an electrical signal. In the mechanical shutter method, light incident on pixels may be physically blocked using a mechanical device. The electrical shutter method may be used in a CMOS image sensor and may electrically control an integration time over which photocharges are generated and accumulated. The electrical shutter method may include a rolling shutter method or a global shutter method. In the rolling shutter method, integration times of pixel array rows may be controlled to be different from each other. In the global shutter method, integration times of all pixel array rows may be controlled to be equal to each other.

SUMMARY

Exemplary embodiments of the present disclosure may provide an image sensor capable of inhibiting a light leakage phenomenon and increasing a light reception rate by changing a travel direction of light incident on a charge storage portion to a direction of a photoelectric conversion portion.

In an exemplary embodiment, an image sensor includes a substrate having a first surface, a charge storage portion disposed in the substrate, a light-blocking pattern disposed on the first surface overlapping the charge storage portion, and a low-refractive index pattern disposed on the light-blocking pattern.

In an exemplary embodiment, an image sensor include a pixel array having a plurality of pixels arranged in a row direction and a column direction, wherein each of the pixels comprises a photoelectric conversion portion and a charge storage portion disposed from the photoelectric conversion portion in a diagonal direction with respect to the row direction or the column direction, a micro lens on the photoelectric conversion portion, and a low-refractive index pattern on the charge storage portion. The micro lens may be spaced apart from the low-refractive index pattern in a vertical direction, and an edge of the micro lens may overlap a portion of the low-refractive index pattern when viewed in a plan view.

In an exemplary embodiment, an image sensor may include a substrate having a first surface and a second surface disposed opposite to each other, a charge storage portion disposed in the substrate, first, second, third and fourth photoelectric conversion portions arranged in a clockwise direction in the substrate to surround the charge storage portion, a light-blocking pattern disposed on the first surface overlapping the charge storage portion, color filters disposed on the first surface overlapping the charge storage portion and the first to fourth photoelectric conversion portions, the color filters covering the light-blocking pattern, a low-refractive index pattern disposed on the light-blocking pattern, and micro lenses overlapping the first to fourth photoelectric conversion portions, respectively. The first and third photoelectric conversion portions may be spaced apart from each other with the charge storage portion interposed therebetween and may be symmetrical with respect to the charge storage portion. The second and fourth photoelectric conversion portions may be spaced apart from each other with the charge storage portion interposed therebetween and may be symmetrical with respect to the charge storage portion. An edge of each of the micro lenses may overlap with a portion of the low-refractive index pattern when viewed in a plan view, and a refractive index of the low-refractive index pattern may be less than a refractive index of the micro lenses.

BRIEF DESCRIPTION OF THE DRAWINGS

Exemplary embodiments of the present disclosure will become more apparent in view of the accompanying detailed description and attached drawings, in which.

DETAILED DESCRIPTION

Hereinafter, image sensors according to exemplary embodiments of the present disclosure will be described with reference to the accompanying drawings.

Figure 1:
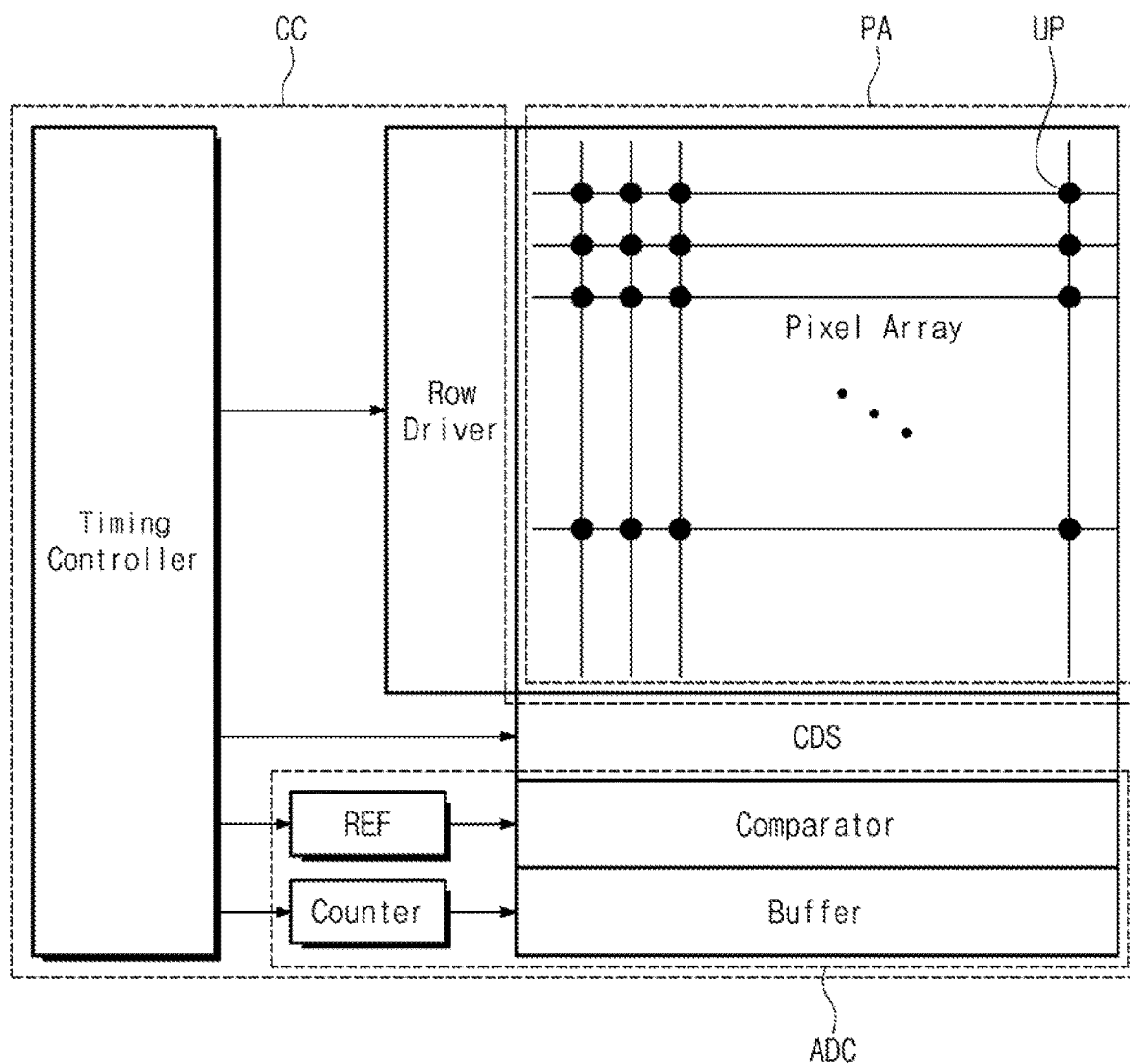
FIG. 1 is a schematic block diagram illustrating an image sensor according to an exemplary embodiment.

FIG. 1 illustrates an image sensor according to an exemplary embodiment. For example, an image sensor of FIG. 1 may be a complementary metal-oxide-semiconductor (CMOS) image sensor.

Referring to FIG. 1, the image sensor may include a pixel array PA and a signal processing unit CC. The pixel array PA may convert incident light into electrical signals. The pixel array PA may include a plurality of unit pixels UP arranged in a matrix form. The pixel array PA may be driven in response to various driving signals provided from the signal processing unit CC and may provide the converted electrical signals to the signal processing unit CC.

The signal processing unit CC may process the electrical signals to generate image data. The signal processing unit CC may include a row driver, a correlated double sampler CDS, an analog-to-digital converter ADC, and a timing controller.

The row driver may be connected to each row of the pixel array PA and may generate a driving signal for driving each row. For example, the row driver may drive the unit pixels UP of the pixel array PA in the unit of row.

The correlated double sampler CDS may obtain a difference between a reference voltage showing a reset state of the unit pixel UP and an output voltage showing a signal corresponding to the incident light by using a capacitor and/or a switcher such as a switched-capacitor operational amplifier, thereby performing a correlated double sampling process. In addition, the correlated double sampler CDS may output an analog sampling signal corresponding to an effective signal component. The correlated double sampler CDS may include CDS circuits that are connected to column lines of the pixel array PA, respectively. The correlated double sampler CDS may output the analog sampling signal corresponding to the effective signal component from each column.

The analog-to-digital converter ADC may convert the analog sampling signal corresponding to the effective signal component into a digital image signal. The analog-to-digital converter ADC may include a reference signal generator REF, a comparator, a counter, and a buffer. The reference signal generator REF may generate a reference signal (e.g., a lamp signal having a certain gradient) and may provide the lamp signal as a reference signal of the comparator. The comparator may compare the analog sampling signal outputted from the correlated double sampler CDS from each column with the lamp signal generated from the reference signal generator REF, thereby outputting comparison signals that have transition time points according to the effective signal components, respectively. The counter may perform a counting operation to generate a counting signal and may provide the counting signal to the buffer. The buffer may include a plurality of latch circuits respectively connected to the column lines. The buffer may latch the counting signal outputted from the counter with respect to each of the column lines in response to the transition of each of the comparison signals, thereby outputting the latched counting signal as image data.

The timing controller may control operation timings of the row driver, the correlated double sampler CDS, and the analog-to-digital converter ADC. The timing controller may provide timing signals and control signals to the row driver, the correlated double sampler CDS, and the analog-to-digital converter ADC.

In the embodiment of FIG. 1, the image sensor may perform the correlated double sampling (CDS) operation on the analog output signals prior to analog-to-digital conversion. However, embodiments of the inventive concepts are not limited thereto. In certain embodiments, the image sensor may perform a digital correlated double sampling (DDS) operation. In the DDS operation, an analog signal for a reset component in an initial state of a pixel and an analog signal for a signal component may be converted into two digital signals, and then, a difference between the two digital signals may be extracted as the effective signal component.

Figure 2A:
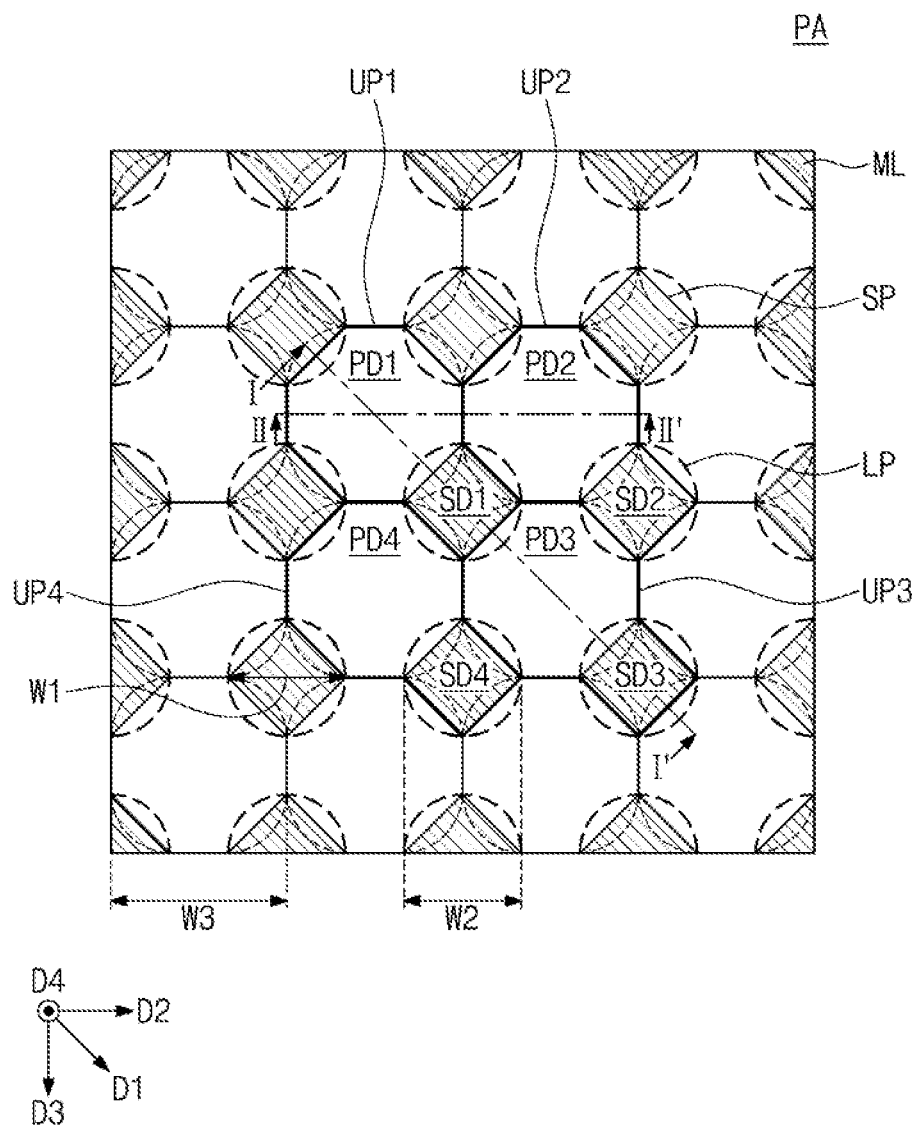
FIG. 2A is a plan view diagram illustrating an image sensor according to an exemplary embodiment.
Figure 2B:
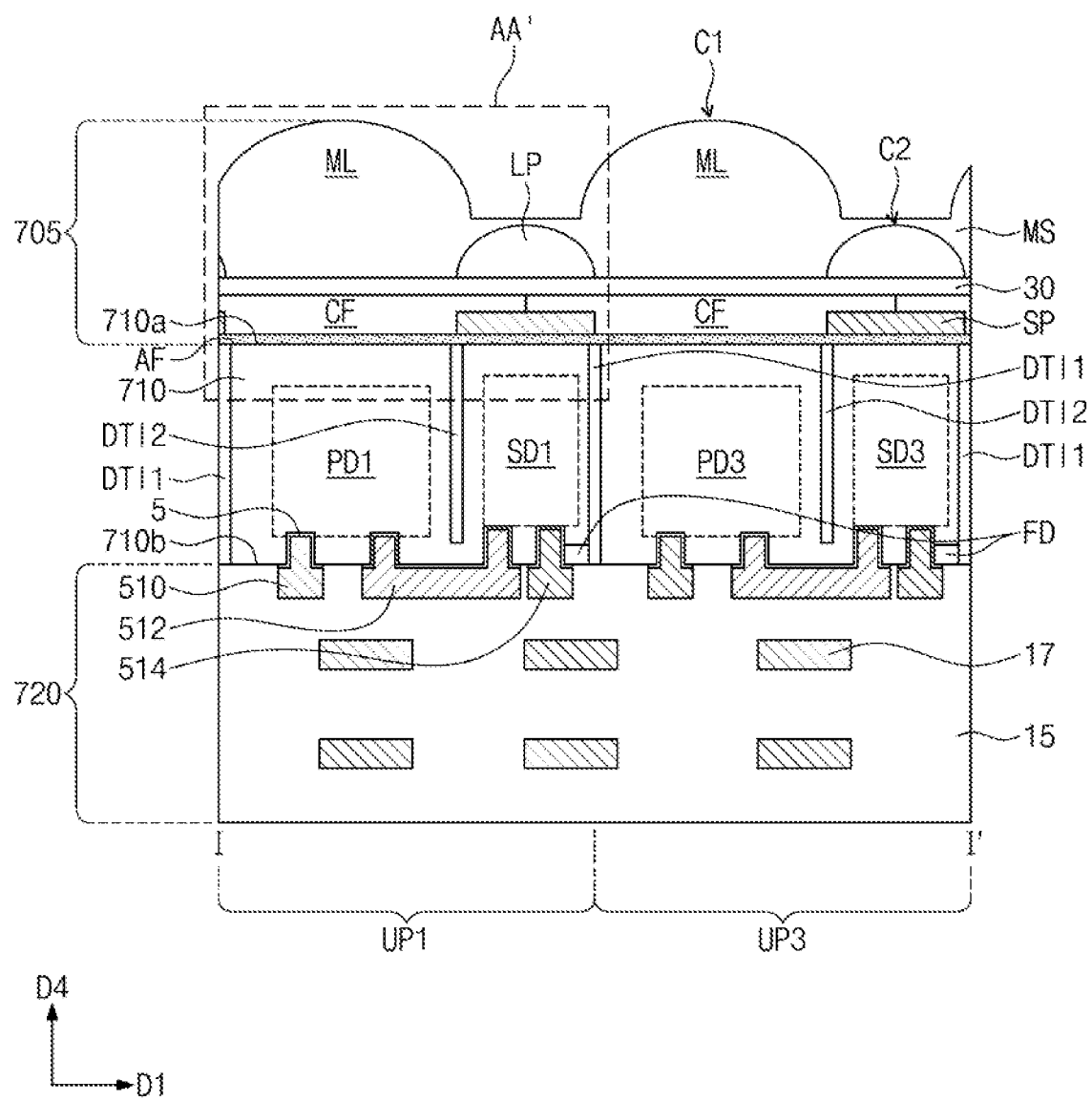
FIG. 2B is a cross-sectional view diagram taken along a line I-I' of FIG. 2A.
Figure 2C:
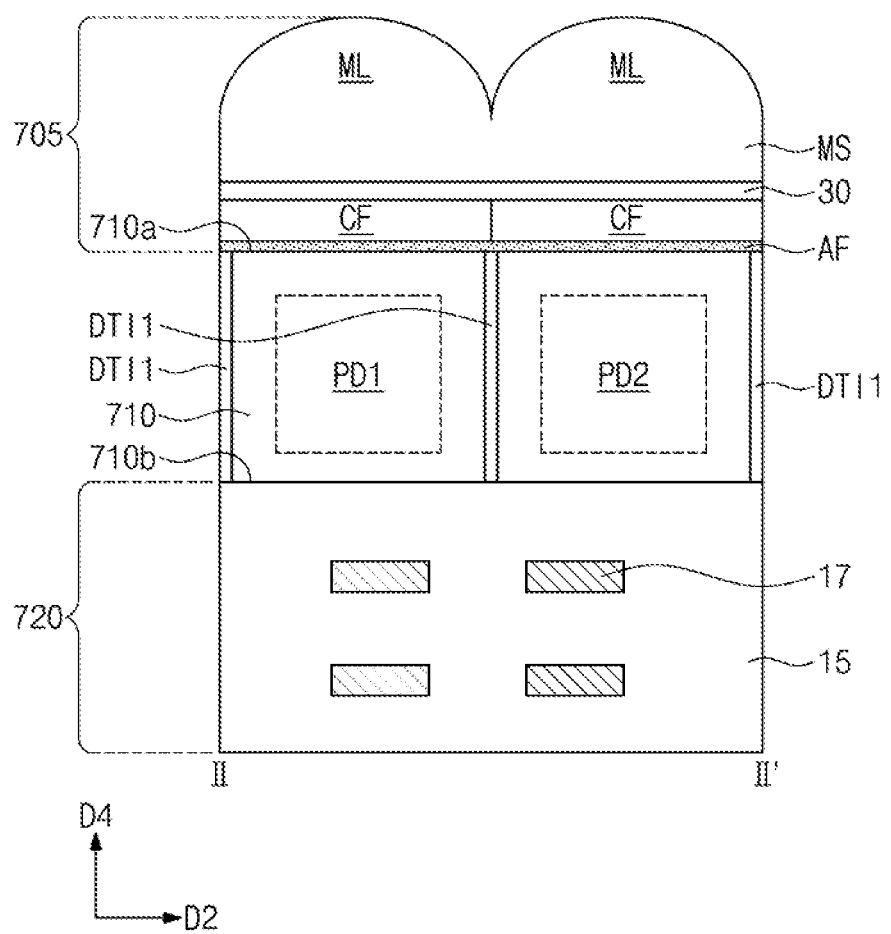
FIG. 2C is a cross-sectional view diagram taken along a line II-II' of FIG. 2A.

FIG. 2A illustrates an image sensor in a plan view according to an exemplary embodiment. FIG. 2B illustrates the image sensor in a cross-sectional view taken along a line I-I' of FIG. 2A. FIG. 2C illustrates the image sensor in a cross-sectional view taken along a line II-II' of FIG. 2A. FIG. 2A may correspond to a plan view of a portion of the pixel array PA of FIG. 1.

Referring to FIGS. 2A, 2B and 2C, a substrate 710 may be provided. The substrate 710 may be a single-crystalline silicon substrate or a silicon-on-insulator (SOI) substrate. The substrate 710 may be doped with dopants of a first conductivity type. For example, the first conductivity type may be a P-type, and the dopants of the first conductivity type may be boron. The substrate 710 may include a first surface 710a and a second surface 710b which are opposite to each other. Light may be incident through the first surface 710a.

A first deep device isolation portion DTI1 may be disposed in the substrate 710 to isolate a plurality of unit pixels UP1, UP2, UP3 and UP4 from each other. Photoelectric conversion portions PD1, PD2, PD3 and PD4 and charge storage portions SD1, SD2, SD3 and SD4, which are spaced apart from each other, may be disposed in the substrate 710 of the unit pixels UP1, UP2, UP3 and UP4, respectively. The image sensor may include the charge storage portions SD1, SD2, SD3 and SD4, and may operate by a global shutter method, but is not limited thereto.

The photoelectric conversion portions PD1, PD2, PD3 and PD4 may be spaced apart from the charge storage portions SD1, SD2, SD3 and SD4, respectively, by a second deep device isolation portion DTI2. The first deep device isolation portion DTI1 may penetrate the substrate 710 and may extend from the first surface 710a to the second surface 710b. The second deep device isolation portion DTI2 may extend from the first surface 710a toward the second surface 710b but may be spaced apart from the second surface 710b. The first and second deep device isolation portions DTI1 and DTI2 may include at least one of a silicon oxide layer, a hafnium oxide layer, an aluminum oxide layer, or a polysilicon layer doped with dopants. Each of the first and second deep device isolation portions DTI1 and DTI2 may have a single-layered or multi-layered structure.

The unit pixels UP1, UP2, UP3 and UP4 may include first to fourth unit pixels UP1, UP2, UP3 and UP4. The photoelectric conversion portions PD1, PD2, PD3 and PD4 may include first to fourth photoelectric conversion portions PD1, PD2, PD3 and PD4. The charge storage portions SD1, SD2, SD3 and SD4 may include first to fourth charge storage portions SD1, SD2, SD3 and SD4.

The photoelectric conversion portions PD1, PD2, PD3 and PD4 and the charge storage portions SD1, SD2, SD3 and SD4 may be regions doped with dopants of a second conductivity type opposite to the first conductivity type. For example, the second conductivity type may be an N-type, and the dopants of the second conductivity type may be phosphorus or arsenic. Each of the photoelectric conversion portions PD1, PD2, PD3 and PD4 may have an octagonal shape when viewed in a plan view. Each of the charge storage portions SD1, SD2, SD3 and SD4 may have a rhombus or lozenge shape when viewed in a plan view. In each of the unit pixels UP1, UP2, UP3 and UP4, the photoelectric conversion portion PD1, PD2, PD3 or PD4 and the charge storage portion SD1, SD2, SD3 or SD4 may be arranged in a first direction D1.

The photoelectric conversion portions PD1 to PD4 may be arranged in a second direction D2 and a third direction D3. The second direction D2 and the third direction D3 may intersect the first direction D1. The second direction D2 may be perpendicular to the third direction D3. The first direction D1 may form an angle of about 45° with the second direction D2 or the third direction D3. The second direction D2 and the third direction D3 may correspond to a row direction and a column direction of the pixel array PA, respectively. A direction perpendicular to the first, second and third directions D1, D2 and D3 may be defined as a fourth direction D4. The fourth direction D4 may be perpendicular to the first surface 710a of the substrate 710.

The first, second, third and fourth photoelectric conversion portions PD1, PD2, PD3 and PD4 may be arranged around the first charge storage portion SD1 in a clockwise direction when viewed in a plan view. The first and third photoelectric conversion portions PD1 and PD3 may be spaced apart from each other in the first direction D1 with the first charge storage portion SD1 interposed therebetween. The first and third photoelectric conversion portions PD1 and PD3 may be symmetrical with respect to the first charge storage portion SD1.

The second and fourth photoelectric conversion portions PD2 and PD4 may be spaced apart from each other with the first charge storage portion SD1 interposed therebetween. The second and fourth photoelectric conversion portions PD2 and PD4 may be symmetrical with respect to the first charge storage portion SD1.

A micro lens layer MS including micro lenses ML arranged in an array form may be provided on the first surface 710a of the substrate 710. Although the micro lenses ML are shown as convex domes with non-convex or flat portions therebetween in the direction D1, the relative proportional dimensions of the convex to non-convex portions is not limited thereto, and larger and/or more complex partially convex shapes (e.g., an inverted saddle shape) may occupy the space of the flat portions in alternate embodiments.

A light-blocking pattern SP and a low-refractive index pattern LP may be disposed between the first surface 710a of the substrate 710 and the micro lens layer MS. The micro lens layer MS, the light-blocking pattern SP and the low-refractive index pattern LP will be described later in more detail.

An overflow gate 510 of an overflow transistor, a storage gate 512 of a storage transistor and a transfer gate 514 of a transfer transistor may be disposed on the second surface 710b of the substrate 710. A floating diffusion region FD may be disposed in the substrate 710 adjacent to a side of the transfer gate 514.

The first deep device isolation portion DTI1 may prevent a crosstalk phenomenon between the unit pixels UP1 to UP4 adjacent to each other. The second deep device isolation portion DTI2 may prevent a crosstalk phenomenon between the photoelectric conversion portion and the charge storage portion in each of the unit pixels UP1 to UP4. Since incident light toward the charge storage portions SD1 to SD4 is blocked, photoelectric conversion in the charge storage portions SD1 to SD4 may be inhibited and the charge storage portions SD1 to SD4 may store only charges (e.g., photocharges) transferred from the photoelectric conversion portions PD1 to PD4. Moreover, the micro lenses ML may redirect incident light away from the charge storage portions and towards the photoelectric conversion portions.

The photoelectric conversion portions PD1 to PD4 may form P-N junctions, which are junctions between p-type and n-type semiconductor materials inside a single crystal of semiconductor, with the substrate 710 adjacent thereto to constitute photodiodes. Photocharges generated by incident light may be accumulated or collected in the photoelectric conversion portions PD1 to PD4.

The overflow transistor including the overflow gate 510 may be connected between a pixel voltage terminal for supplying a pixel voltage and the photodiode. The overflow gate 510 may prevent charges generated in the photodiode, such as the photocharges, from overflowing into the charge storage portion SD1, SD2, SD3 or SD4.

Each storage transistor including the storage gate 512 may be connected between each of the photoelectric conversion portions PD1 through PD4 and each of the charge storage portions SD1 through SD4, respectively, and may transfer charges from each of the photoelectric conversion portions PD1 through PD4 to each of the charge storage portions SD1 through SD4, respectively.

Each transfer transistor including the transfer gate 514 may be located between the respective floating diffusion region FD and the charge storage portion SD1, SD2, SD3 or SD4. The charges stored in the charge storage portion SD1, SD2, SD3 or SD4 may be transferred to the respective floating diffusion region FD by the transfer gate 514. An insulating layer 5 may be disposed between the substrate 710 and the overflow gate 510, between the substrate 710 and the storage gate 512, and between the substrate 710 and the transfer gate 514. The insulating layer 5 may include at least one of $SiO_2$, SiON, SiN, $Al_2O_3$, $Si_3N_4$, $Ge_xO_yN_z$, $Ge_xSi_yO_z$, or $ZrSiO_4$ (zirconium silicate) and/or a high-k dielectric material. The high-k dielectric material may include at least one of $HfO_2$, $ZrO_2$, $Ta_2O_5$, or $HfSiO_4$ (hafnium silicate).

An incidence layer 705 may include an anti-reflection layer AF, the light-blocking pattern SP, a color filter CF, a planarization layer 30, the low-refractive index pattern LP, and the micro lens layer MS including the micro lenses ML. The anti-reflection layer AF may be disposed on the photoelectric conversion portions PD1 to PD4 and the charge storage portions SD1 to SD4. The anti-reflection layer AF may include, for example, a silicon nitride layer. A fixed charge layer may be disposed between the anti-reflection layer AF and the first surface 710a. The fixed charge layer may include a metal oxide such as $HfO_x$ or $AlO_x$.

The light-blocking pattern SP may be disposed on the anti-reflection layer AF. The light-blocking pattern SP may overlap each of the charge storage portions SD1 to SD4. In other words, the photoelectric conversion portions PD1 to PD4 may be exposed by the light-blocking pattern SP. The light-blocking pattern SP may include a metal such as tungsten (W) or titanium (Ti). The light-blocking pattern SP may include portions spaced apart from each other. Each of the light-blocking pattern portions may have a first width W1 in the second direction D2.

The color filter CF may be disposed on the anti-reflection layer AF and may cover the light-blocking pattern SP. The color filter CF may cover a top surface and a sidewall of the light-blocking pattern SP. A level of a top surface of the color filter CF may be higher than a level of the top surface of the light-blocking pattern SP. The color filter CF may selectively transmit light of a specific wavelength, such as red light, green light, blue light, magenta light, yellow light, or cyan light, but not limited thereto.

The planarization layer 30 may be provided on the color filter CF. The planarization layer 30 may be disposed on the photoelectric conversion portions PD1 to PD4 and the charge storage portions SD1 to SD4. The planarization layer 30 may include the same or similar transparent photoresist material or transparent thermosetting resin as the micro lens ML.

The low-refractive index pattern LP may be provided on the light-blocking pattern SP with the planarization layer 30 interposed therebetween. The low-refractive index pattern LP may overlap with the light-blocking pattern SP. The low-refractive index pattern LP may have lens shaped portions having a curvature. The lens shaped portions of the low-refractive index pattern LP may be spaced apart from each other. Each of the lens shaped portions of the low-refractive index pattern LP may have one surface parallel to the first surface 710a of the substrate 710, and another surface which is convex. The lens shaped portions of the low-refractive index pattern LP may each have a circular shape when viewed in a plan view. A refractive index of the low-refractive index pattern LP may be less than a refractive index of the color filter CF. The lens shaped portions of the low-refractive index pattern LP may have a second width W2 in the second direction D2. The second width W2 may be equal to or greater than the first width W1.

The low-refractive index pattern LP may include a transparent photoresist material or a transparent thermosetting resin. The refractive index of the low-refractive index pattern LP may be less than a refractive index of the planarization layer 30. The refractive index of the low-refractive index pattern LP may be less than a refractive index of the micro lens ML.

The micro lens layer MS may be provided on the planarization layer 30. The micro lens layer MS may include the micro lenses ML. The micro lenses ML may be portions of the micro lens layer MS which have convex curvatures. The micro lenses ML may be disposed on the photoelectric conversion portions PD1 to PD4, respectively. The micro lenses ML may be spaced apart from the lens shaped portions of the low-refractive index pattern LP in the fourth direction D4.

The micro lenses ML may have a third width W3 in the second direction D2. The third width W3 may be greater than the second width W2 of the lens shaped portions of the low-refractive index pattern LP. The refractive index of the micro lenses ML may be greater than the refractive index of the low-refractive index pattern LP. A curvature C1 of each micro lens ML may be less than a curvature C2 of each lens shaped portion of the low-refractive index pattern LP. In other words, a radius of curvature of a micro lens ML may be greater than a radius of curvature of an adjacent lens shaped portion of the low-refractive index pattern LP.

An interconnection layer 720 may include conductive lines 17 which are disposed in an interlayer insulating layer 15 and arranged as a plurality of stacked layers. The conductive lines 17 may transmit control signals supplied to the transistors and/or signals between the unit pixel and the outside. The conductive lines 17 may be formed by patterning a conductive material including, for example, a metal material such as copper and/or aluminum.

Figure 3:
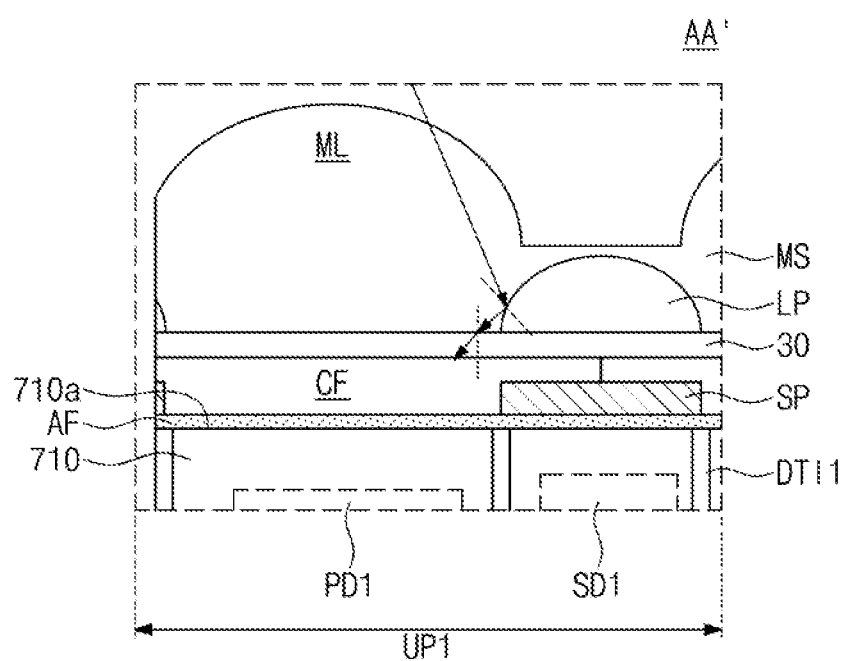
FIG. 3 is a conceptual view diagram illustrating a case in which light is incident on a low-refractive index pattern.

FIG. 3 illustrates a case in which light is incident on the low-refractive index pattern LP. Referring to FIG. 3, if a portion of light transmitted through the micro lens layer MS is incident to each of the charge storage portions SD1 to SD4, rather than to each of the photoelectric conversion portions PD1 to PD4, charges may be generated in each of the charge storage portions SD1 to SD4 by photoelectric conversion, and noise may be generated in a pixel signal by the generated charges.

The total internal reflection of light may occur when light has an angle of incidence larger than a critical angle from a material having a high refractive index to a material having a low refractive index. According to embodiments of the present disclosure, light directed towards each of the charge storage portions SD1 to SD4 may be reflected at an interface between the micro lens layer MS having a relatively high refractive index and the low-refractive index pattern LP having a relatively low refractive index, and may then travel toward one of the photoelectric conversion portions PD1 to PD4. The reflected light may pass through the planarization layer 30 of which the refractive index is greater or higher than that of the low-refractive index pattern LP, and thus the light may be incident upon one of the photoelectric conversion portions PD1 to PD4.

Figure 4A:
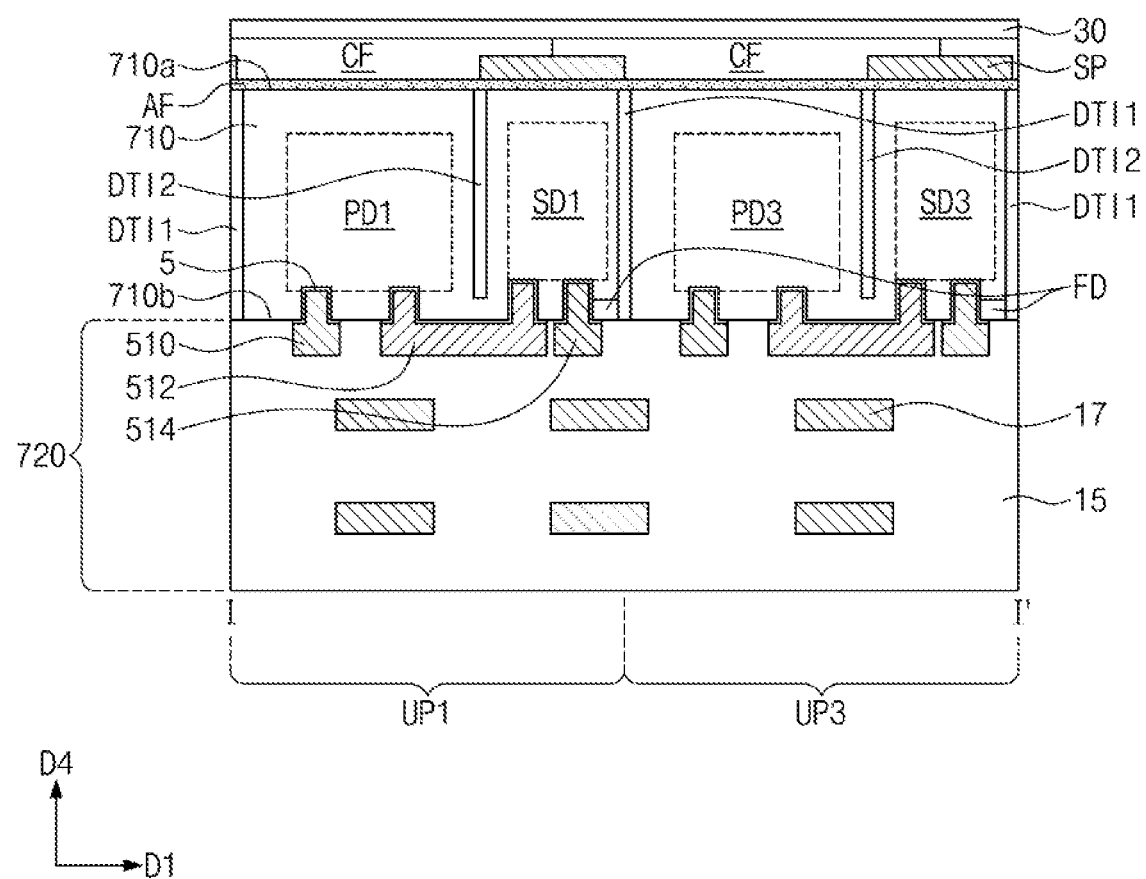
FIGS. 4A to 4F are cross-sectional view diagrams corresponding to the line I-I' of FIG. 2A to illustrate a method of manufacturing an image sensor according to an exemplary embodiment.

FIGS. 4A to 4F show cross-sectional views corresponding to the line I-I' of FIG. 2A to illustrate a method of manufacturing an image sensor, according to an exemplary embodiment of the present disclosure. Referring to FIG. 4A, photoelectric conversion portions PD1 to PD4 and charge storage portions SD1 to SD4, which have a second conductivity type, may be formed in a substrate 710 having a first conductivity type.

An overflow gate 510 of an overflow transistor, a storage gate 512 of a storage transistor and a transfer gate 514 of a transfer transistor may be formed on the second surface 710b of the substrate 710. A floating diffusion region FD may be formed in the substrate 710 at a side of the transfer gate 514. The floating diffusion region FD may be adjacent to the second surface 710b of the substrate 710. An interconnection layer 720 may be formed to cover the second surface 710b of the substrate 710. The first surface 710a of the substrate 710 may be ground. Trenches extending from the first surface 710a toward the second surface 710b may be formed in the substrate 710, and first and second deep device isolation portions DTI1 and DTI2 may be formed by filling the trenches with an insulating material.

An anti-reflection layer AF may be formed on the first surface 710a of the substrate 710. The anti-reflection layer AF may be formed by a chemical vapor deposition (CVD) process or an atomic layer deposition (ALD) process. Light-blocking patterns SP may be formed on the anti-reflection layer AF. The light-blocking patterns SP may be formed by a metal sputtering process using a mask. The metal may include titanium or tungsten.

Color filters CF may be formed to cover the light-blocking patterns SP. The color filters CF may be formed by performing a photolithography process a plurality of times. The color filters CF may cover top surfaces and sidewalls of the light-blocking patterns SP. A planarization layer 30 may be formed on the color filters CF. The planarization layer 30 may be formed by a CVD process or an ALD process.

Figure 4B:
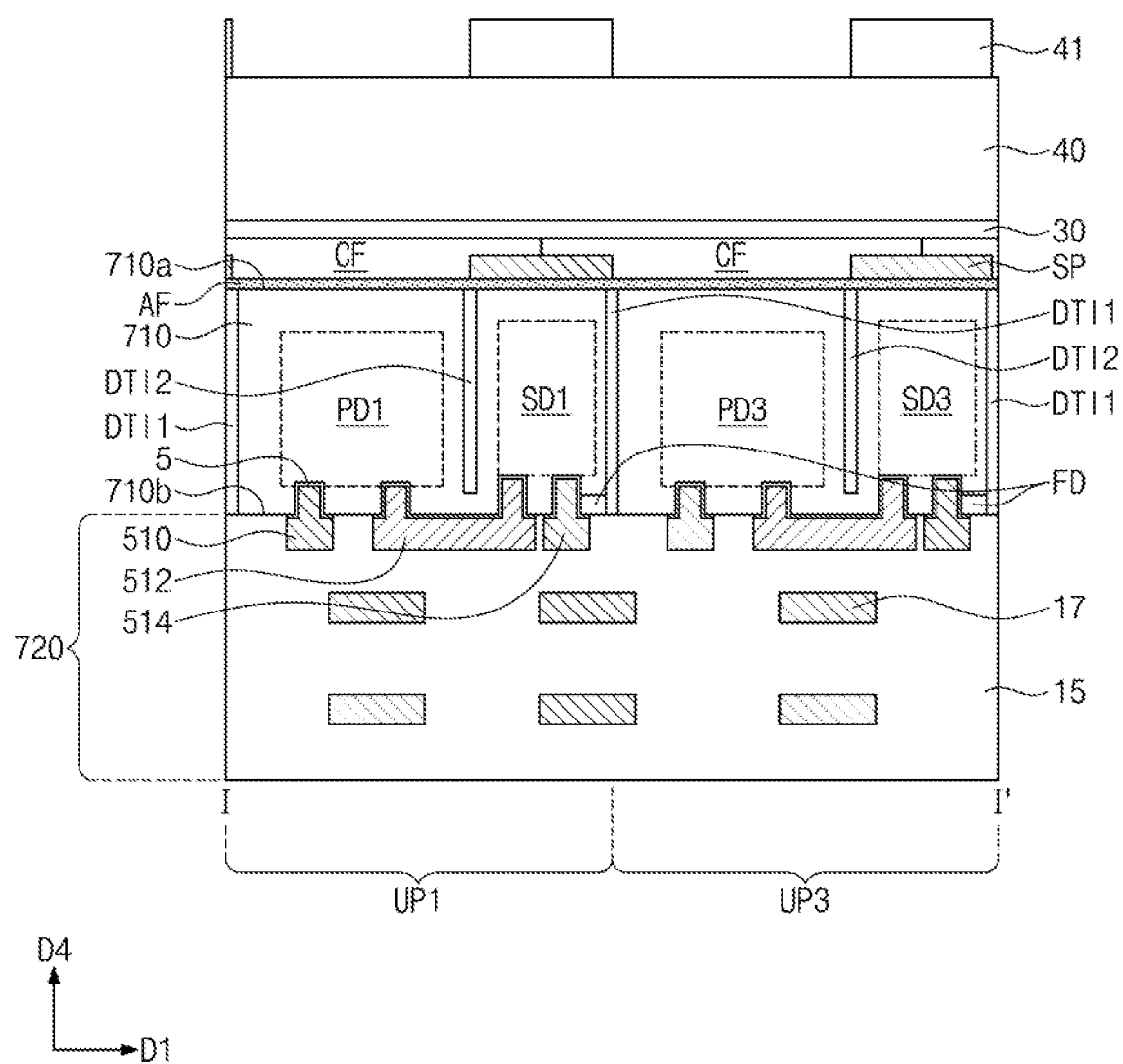

Referring to FIG. 4B, a first preliminary lens layer 40 may be formed on the planarization layer 30. The first preliminary lens layer 40 may include a transparent photoresist material or a transparent thermosetting resin. First photoresist patterns 41 may be formed on the first preliminary lens layer 40. The first photoresist patterns 41 may be formed to overlap with the charge storage portions SD1 to SD4 in the fourth direction D4, respectively.

Figure 4C:
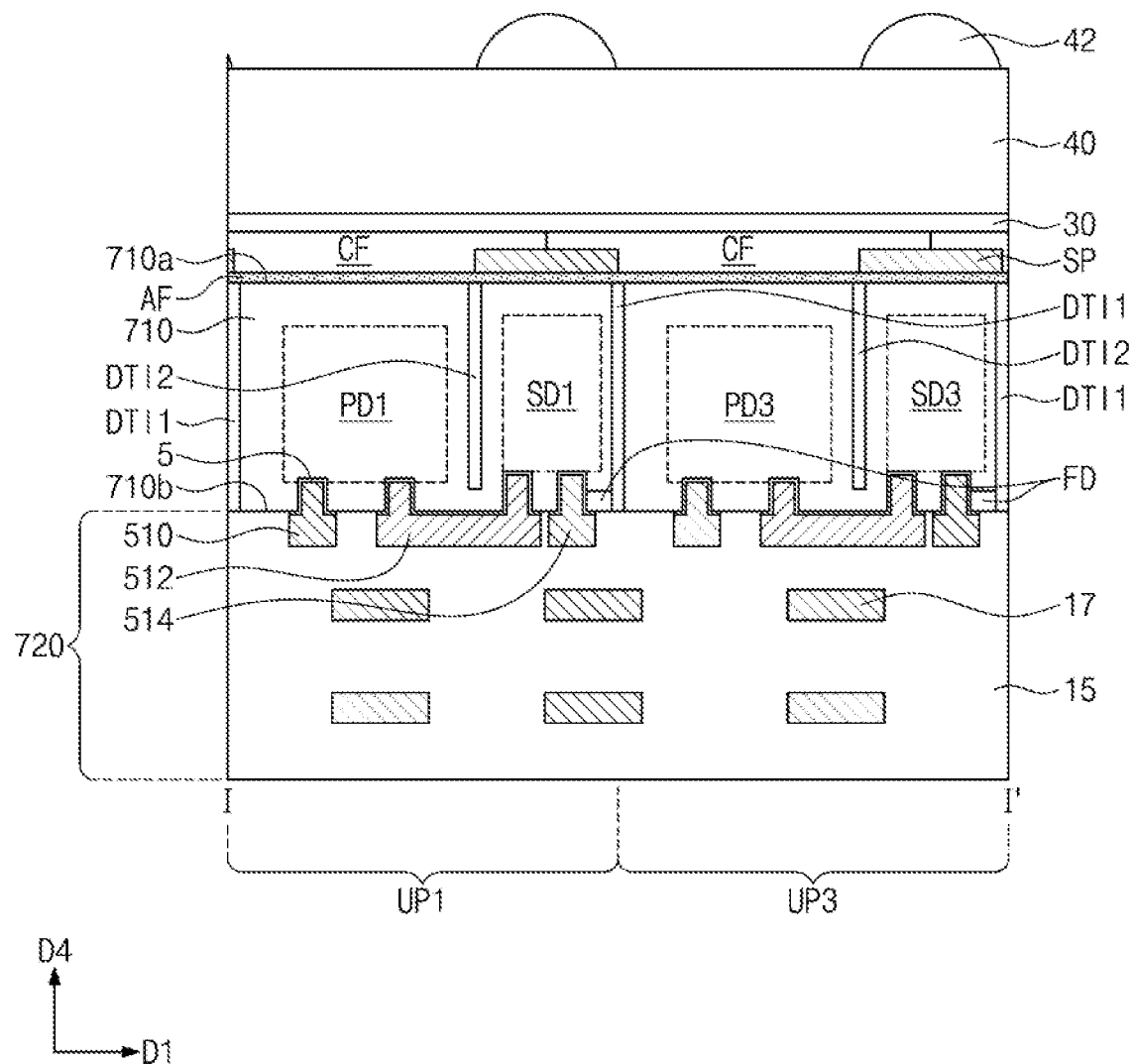

Referring to FIG. 4C, first preliminary lens patterns 42 having round shapes may be formed by reflowing the first photoresist patterns 41.

Figure 4D:
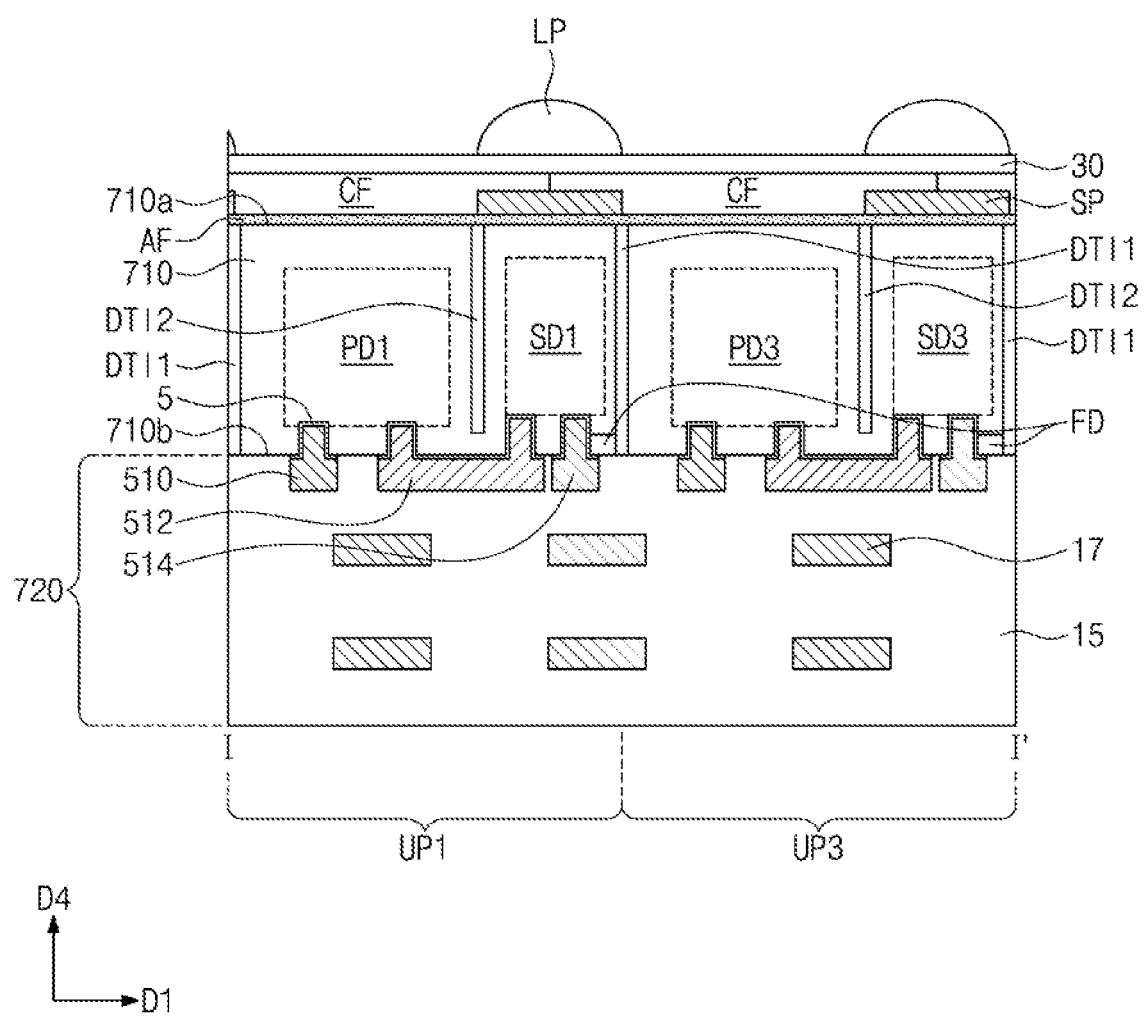

Referring to FIG. 4D, a blanket etching process may be performed on the first preliminary lens layer 40. In the blanket etching process, the first preliminary lens patterns 42 may also be etched. The shapes of the first preliminary lens patterns 42 may be transferred to the first preliminary lens layer 40, and thus low-refractive index patterns LP having convex lens shapes may be formed.

Figure 4E:
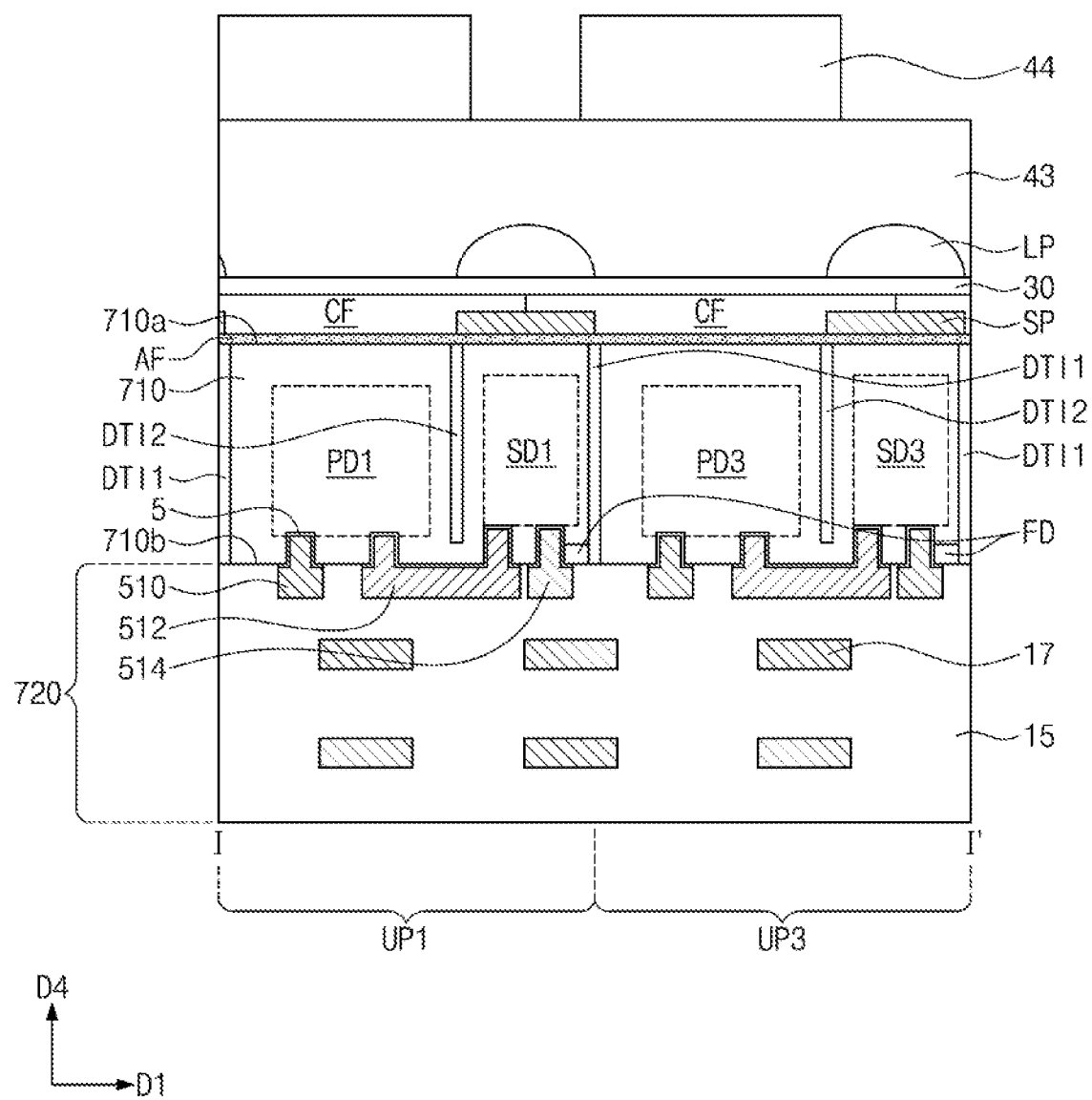

Referring to FIG. 4E, a second preliminary lens layer 43 may be formed on the low-refractive index patterns LP and the planarization layer 30. The second preliminary lens layer 43 may include a transparent photoresist material or a transparent thermosetting resin. The second preliminary lens layer 43 may include a material of which a refractive index is higher than that of the first preliminary lens layer 40. Second photoresist patterns 44 may be formed on the second preliminary lens layer 43. The second photoresist patterns 44 may be formed to overlap with the photoelectric conversion portions PD1 to PD4 of the unit pixels UP1 to UP4 in the fourth direction D4, respectively.

Figure 4F:
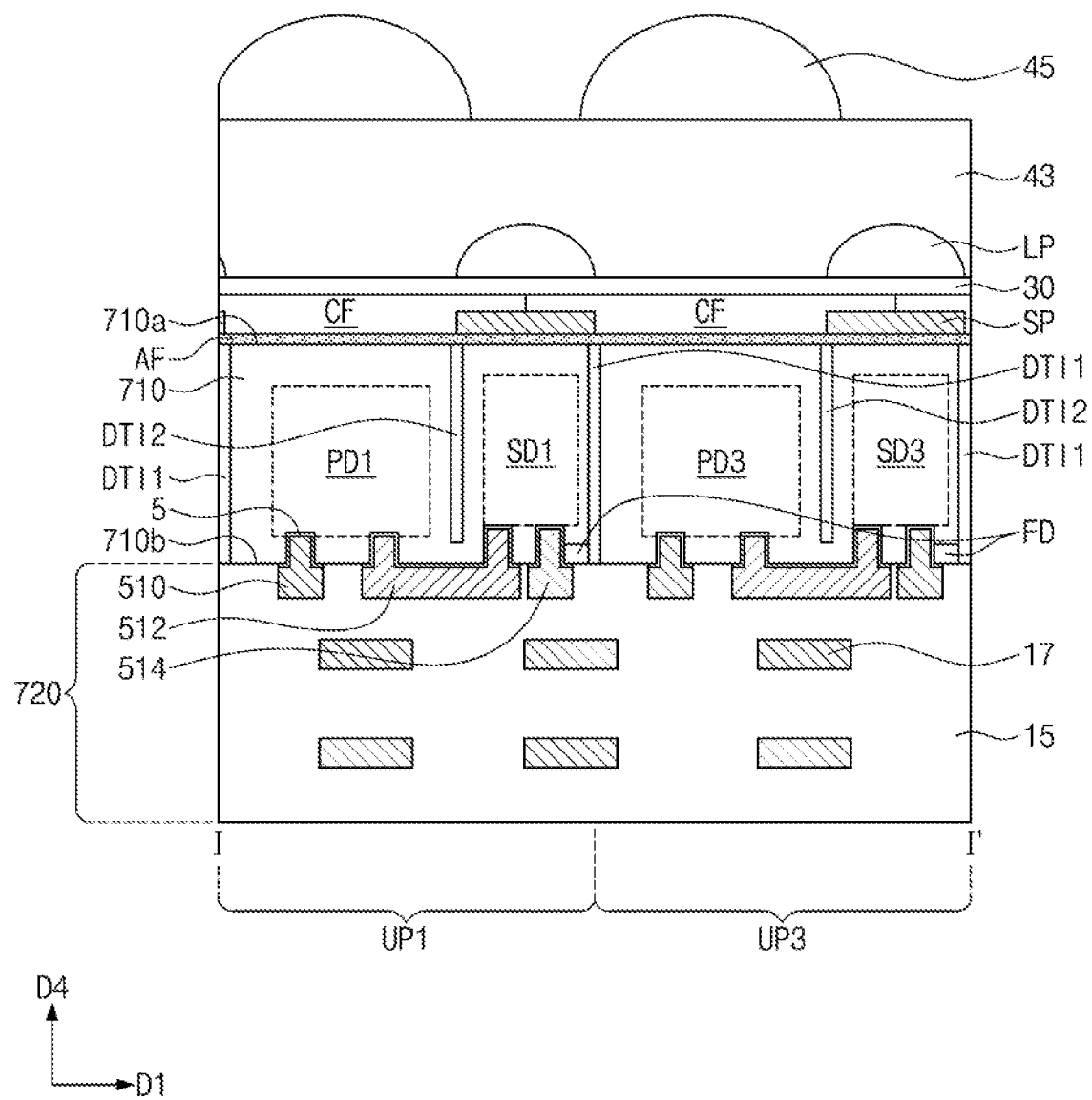

Referring to FIG. 4F, second preliminary lens patterns 45 having round shapes may be formed by reflowing the second photoresist patterns 44.

Referring again to FIG. 2B, a blanket etching process may be performed on the second preliminary lens layer 43. In the blanket etching process, the second preliminary lens patterns 45 may also be etched. The shapes of the second preliminary lens patterns 45 may be transferred to the second preliminary lens layer 43, and thus the micro lens layer MS including the micro lenses ML may be formed.

Figure 5:
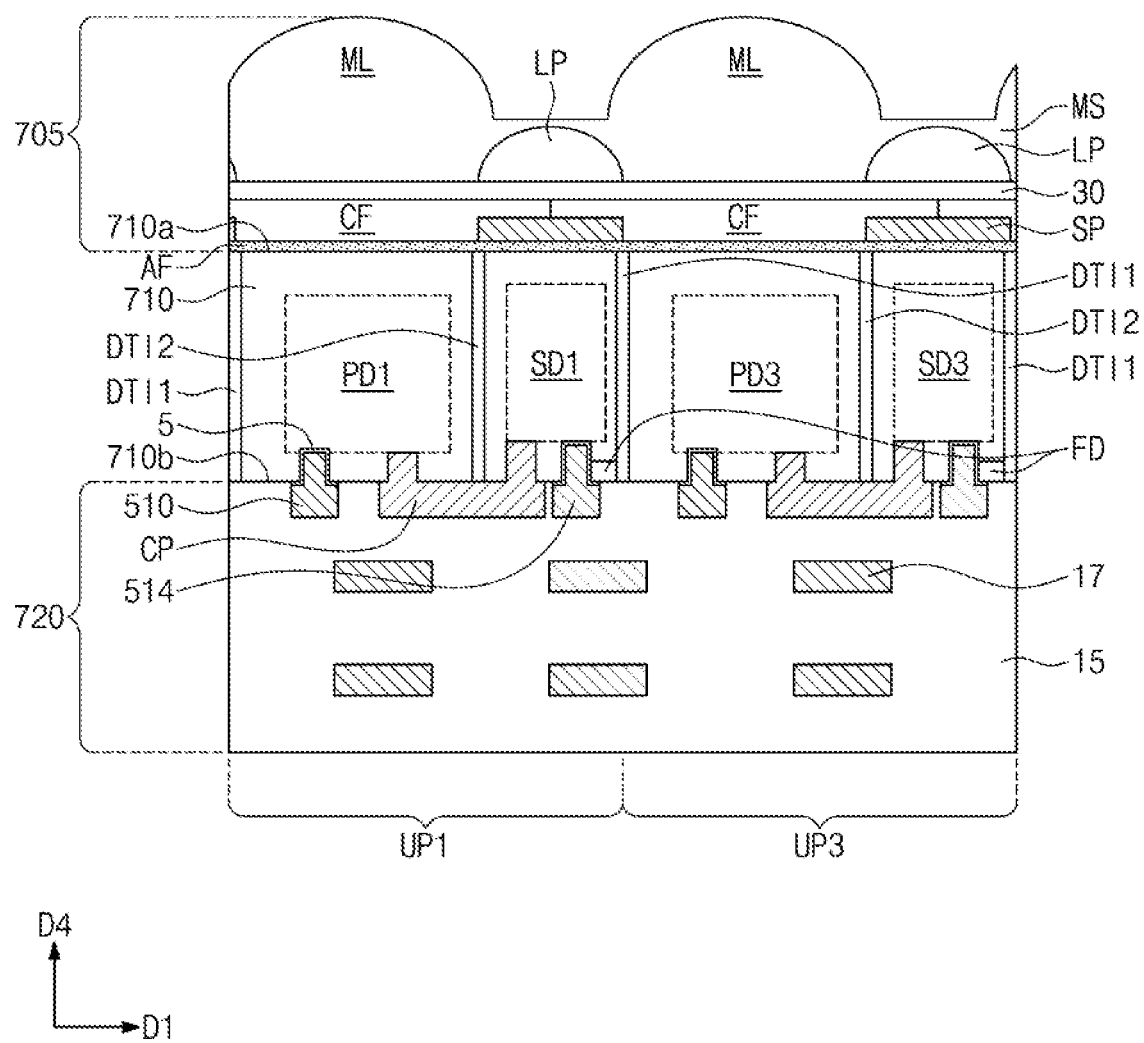
FIG. 5 is a cross-sectional view diagram corresponding to the line I-I' of FIG. 2A to illustrate an image sensor according to an exemplary embodiment.

FIG. 5 illustrates a cross-sectional view corresponding to the line I-I' of FIG. 2A to illustrate an image sensor according to an exemplary embodiment of the present disclosure. Hereinafter, duplicate descriptions of the same or like components and features as in the embodiment of FIG. 2B will be omitted for brevity of explanation.

Referring to FIG. 5, a second deep device isolation portion DTI2 may penetrate the substrate 710 and may extend from the first surface 710a to the second surface 710b. A conductive pattern CP may be provided instead of the storage transistor including the storage gate 512. The conductive pattern CP may transfer charges from each of the photoelectric conversion portions PD1 to PD4 to each of the charge storage portions SD1 to SD4. The conductive pattern CP may electrically connect each of the photoelectric conversion portions PD1 to PD4 to each of the charge storage portions SD1 to SD4.

Figure 6:
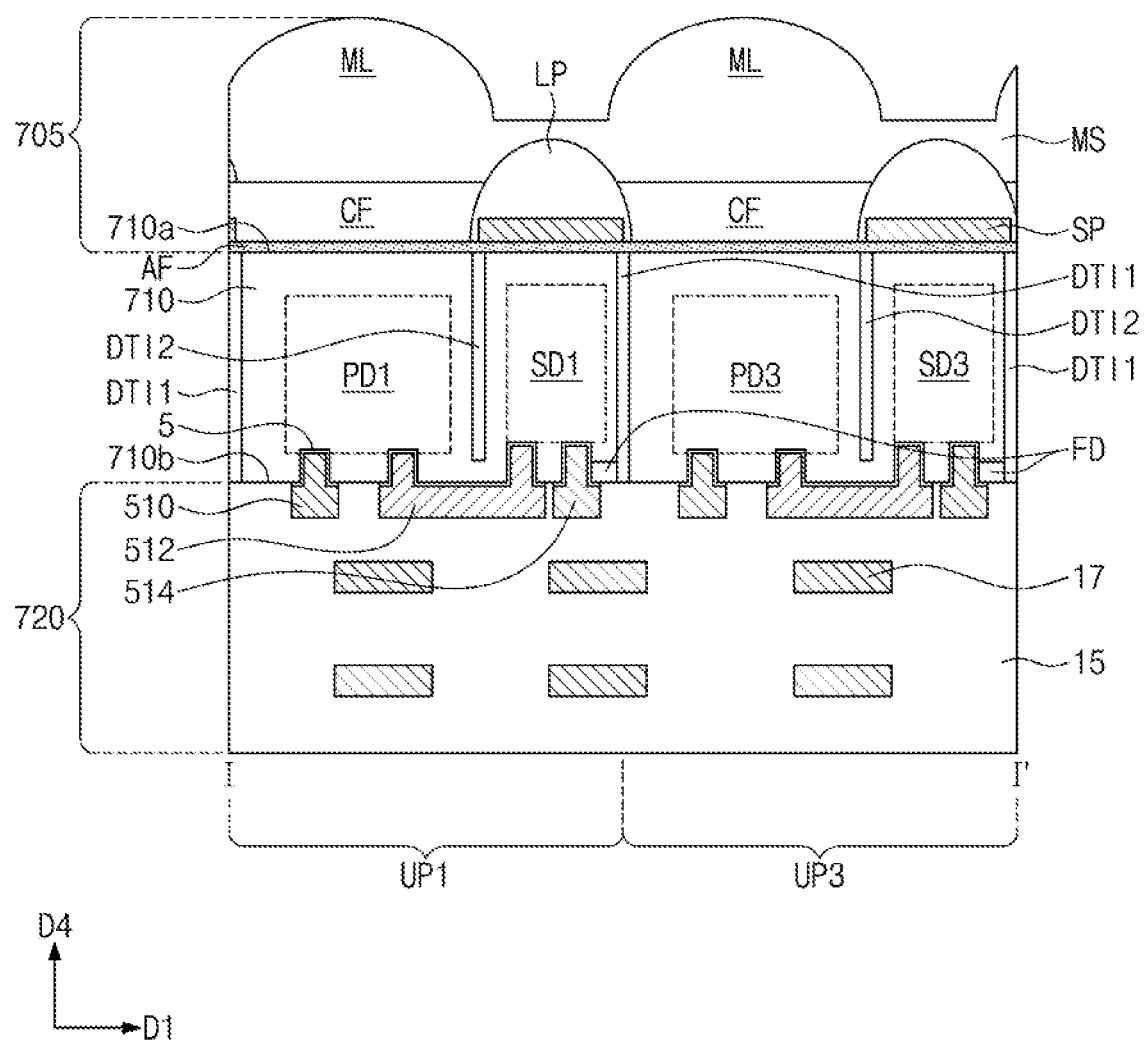
FIG. 6 is a cross-sectional view diagram corresponding to the line I-I' of FIG. 2A to illustrate an image sensor according to an exemplary embodiment.

FIG. 6 illustrates a cross-sectional view corresponding to the line I-I' of FIG. 2A to illustrate an image sensor according to an exemplary embodiment of the present disclosure. Hereinafter, duplicate descriptions of the same or like components and features as in the embodiment of FIG. 2B will be omitted for brevity of explanation.

Referring to FIG. 6, a low-refractive index pattern LP may cover the top surface and both sidewalls of the light-blocking pattern SP. The low-refractive index pattern LP may be in contact with the top surface and the both sidewalls of the light-blocking pattern SP. A portion of a sidewall of the low-refractive index pattern LP may be in contact with the color filter CF. The planarization layer 30 may be omitted in the present embodiments.

Figure 7:
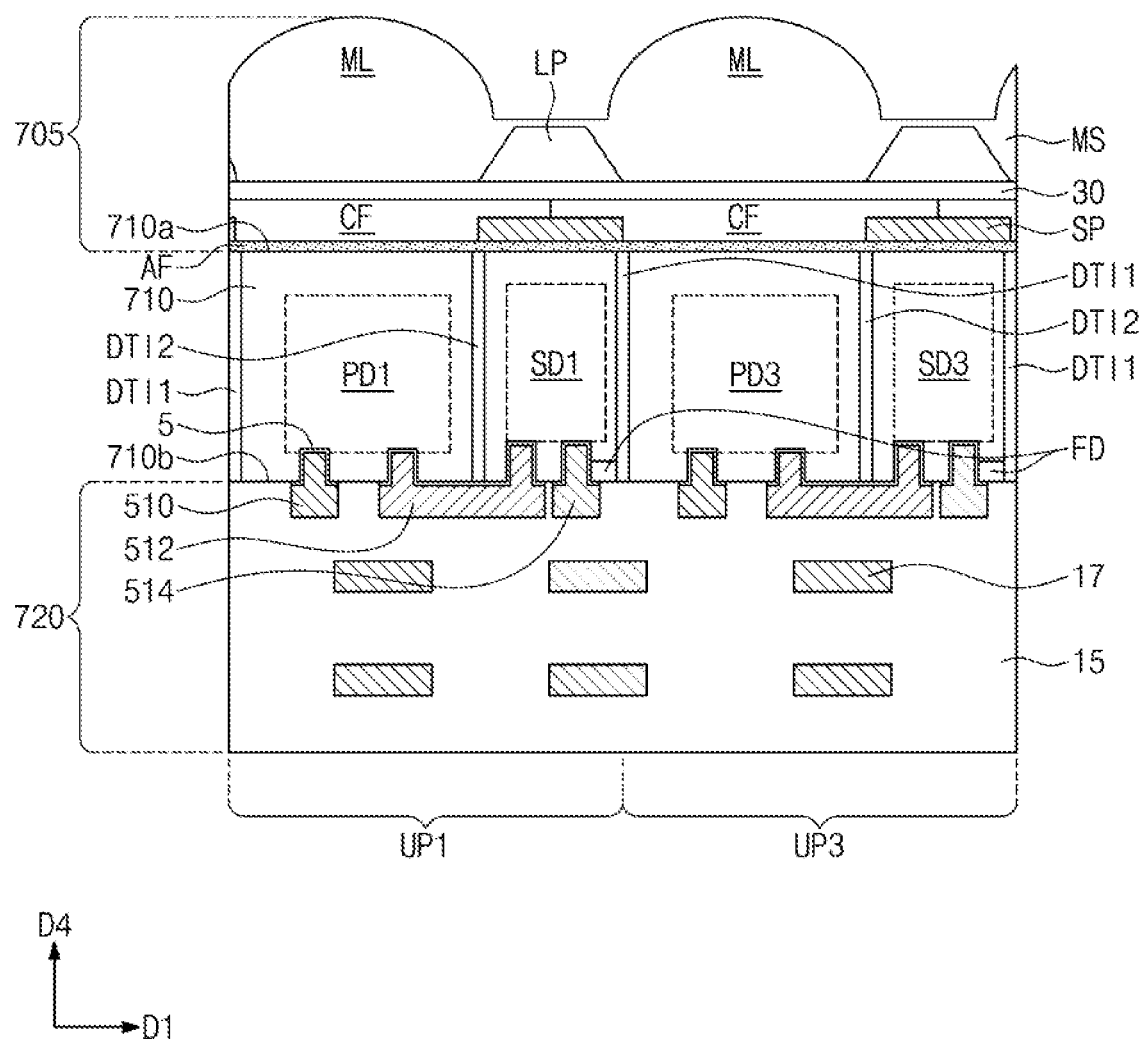
FIG. 7 is a cross-sectional view diagram corresponding to the line I-I' of FIG. 2A to illustrate an image sensor according to an exemplary embodiment.

FIG. 7 illustrates a cross-sectional view corresponding to the line I-I' of FIG. 2A to illustrate an image sensor according to an exemplary embodiment of the present disclosure. Hereinafter, duplicate descriptions of the same or like components and features as in the embodiment of FIG. 2B will be omitted for brevity of explanation.

Referring to FIG. 7, a sidewall of a low-refractive index pattern LP may be inclined. For example, the low-refractive index pattern LP may have a trapezoidal shape when viewed in a cross-sectional view. A cross-sectional area of the low-refractive index pattern LP which is parallel to the first direction D1 may decrease in the fourth direction D4.

Figure 8:
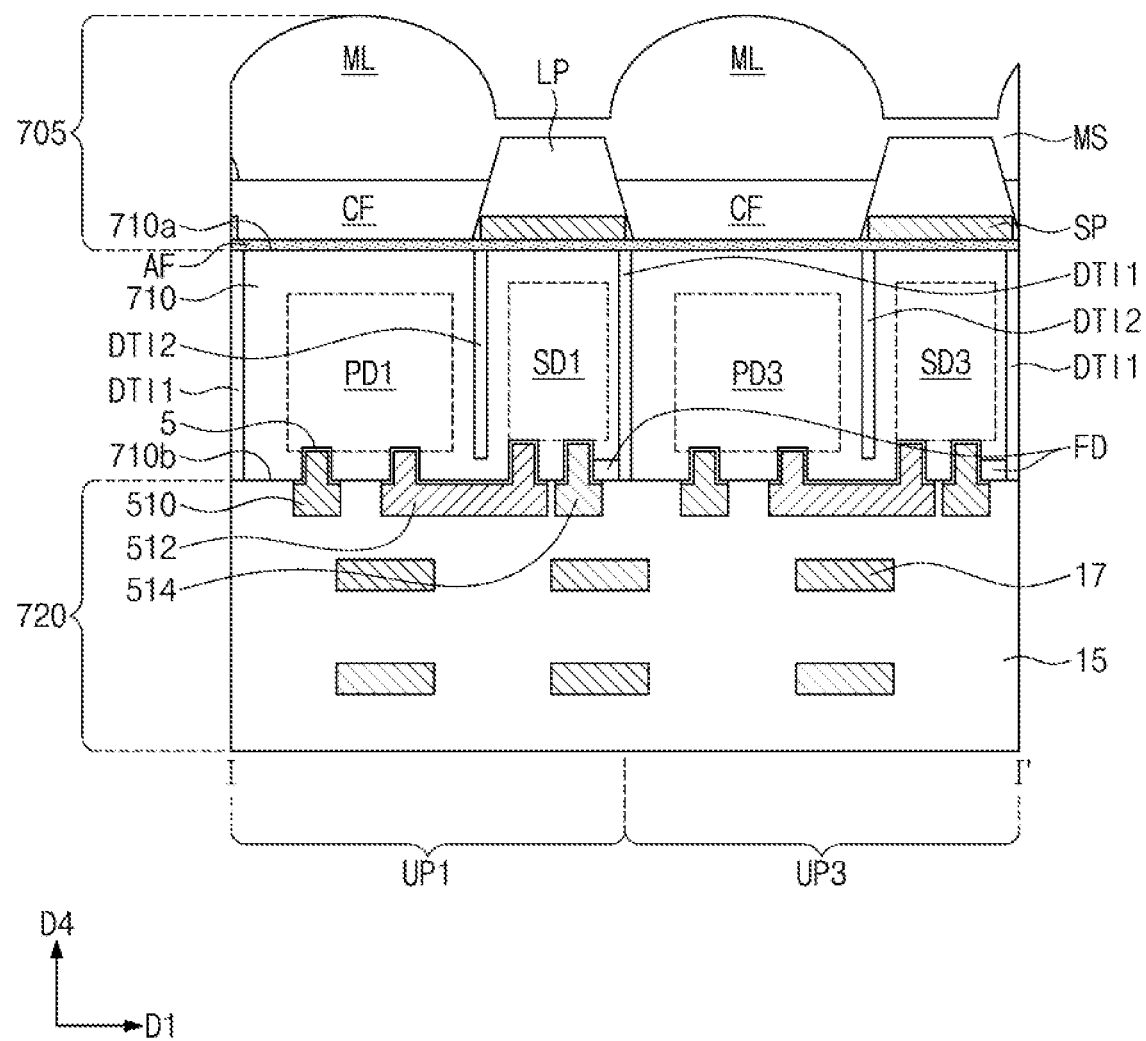
FIG. 8 is a cross-sectional view diagram corresponding to the line I-I' of FIG. 2A to illustrate an image sensor according to an exemplary embodiment.

FIG. 8 illustrates a cross-sectional view corresponding to the line I-I' of FIG. 2A to illustrate an image sensor according to an exemplary embodiment of the present disclosure. Hereinafter, duplicate descriptions of the same or like components and features as in the embodiment of FIG. 2B will be omitted for brevity of explanation.

Referring to FIG. 8, a sidewall of a low-refractive index pattern LP may be inclined. For example, the low-refractive index pattern LP may have a trapezoidal shape when viewed in a cross-sectional view. A cross-sectional area of the low-refractive index pattern LP which is parallel to the first direction D1 may decrease in the fourth direction D4. The low-refractive index pattern LP may cover the top surface and both sidewalls of the light-blocking pattern SP. The low-refractive index pattern LP may be in contact with the top surface and the sidewalls of the light-blocking pattern SP. A portion of a sidewall of the low-refractive index pattern LP may be in contact with the color filter CF. The planarization layer 30 may be omitted in the present embodiment.

Figure 9A:
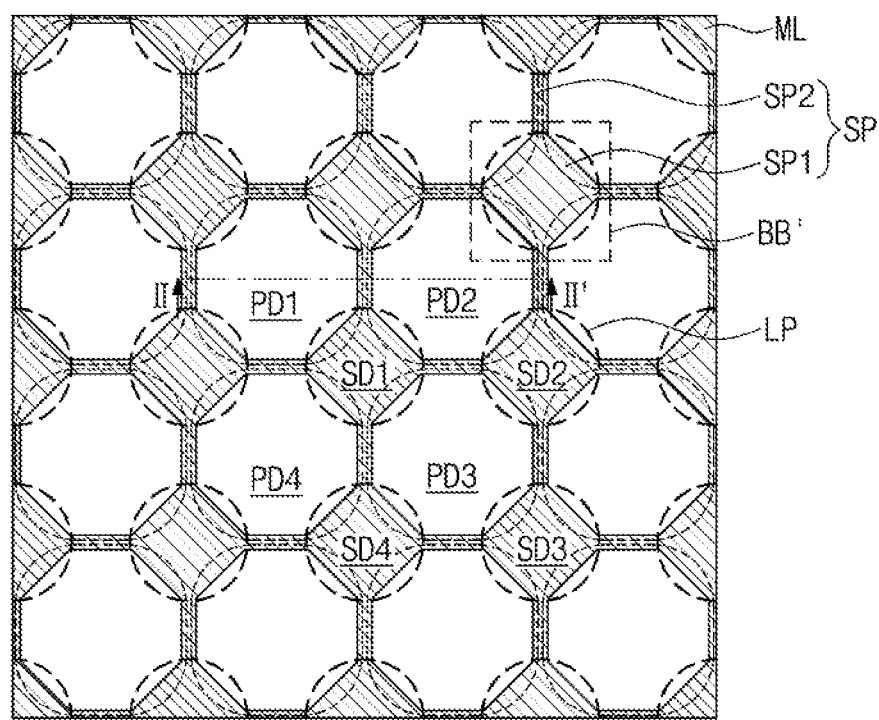
FIG. 9A is a plan view diagram illustrating an image sensor according to an exemplary embodiment.
Figure 9A:
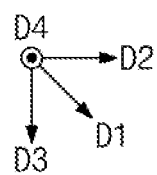
Figure 9B:
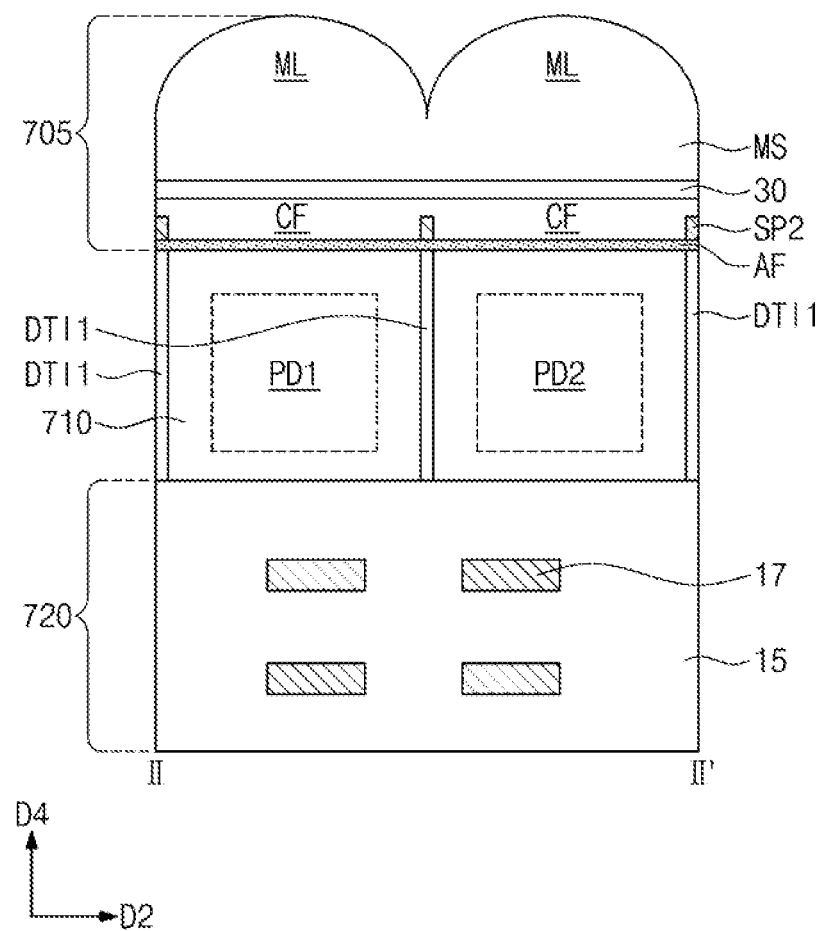
FIG. 9B is a cross-sectional view diagram taken along a line II-II' of FIG. 9A.
Figure 9C:
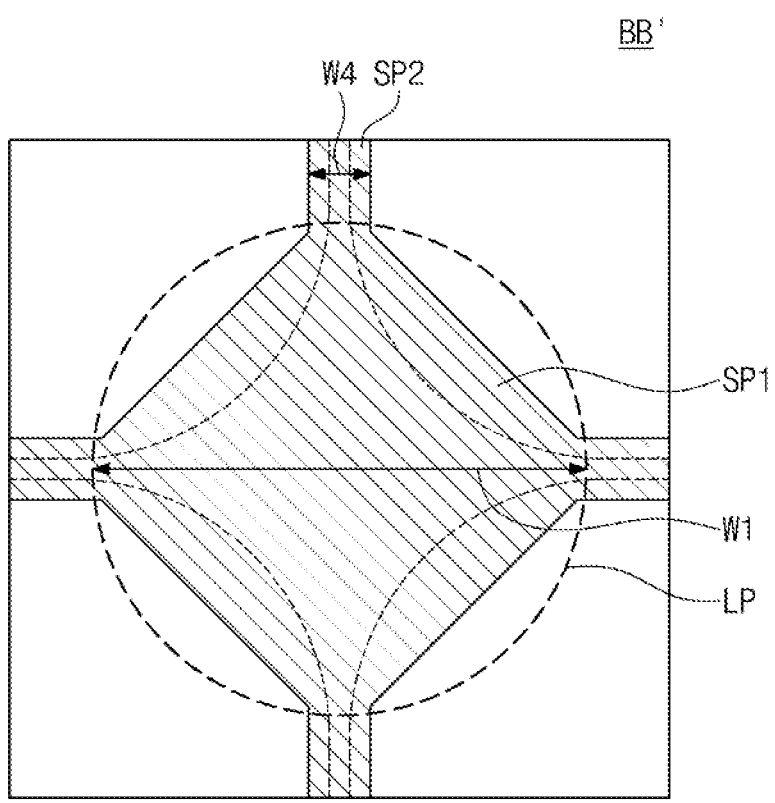
FIG. 9C is an enlarged plan view diagram of a portion BB' of FIG. 9A.

FIG. 9A illustrates a plan view of an image sensor according to an exemplary embodiment of the present disclosure. FIG. 9B illustrates a cross-sectional view taken along a line II-II' of FIG. 9A. FIG. 9C illustrates an enlarged view of a portion BB' of FIG. 9A.

Referring to FIGS. 9A, 9B and 9C, a light-blocking pattern SP may include a first portion SP1 on each of the charge storage portions SD1 to SD4, and a second portion SP2 extending onto the first deep device isolation portion DTI1. Due to the second portion SP2 of the light-blocking pattern SP, a top surface of the first deep device isolation portion DTI1 need not be exposed. The second portion SP2 of the light-blocking pattern SP may have a grid shape when viewed in a plan view.

Each of the first and second portions SP1 and SP2 of the light-blocking pattern SP may have a width in the second direction D2. A first width W1, in the second direction D2, of the first portion SP1 of the light-blocking pattern SP may be greater than a width W4, in the second direction D2, of the second portion SP2 of the light-blocking pattern SP.

In the image sensor according to exemplary embodiments of the present disclosure, light incident toward the light-blocking pattern may be reflected and may then be incident to a corresponding pixel. Thus, a light leakage phenomenon may be reduced and light efficiency may be increased.

While the inventive concept has been shown and described with reference to exemplary embodiments, it will be apparent to those of ordinary skill in the pertinent art that various changes and modifications may be made without departing from the scope and sprit of the present disclosure. Therefore, it should be understood that the above embodiments are not limiting, but illustrative. The scope of the inventive concept is to be determined by the broadest permissible interpretation of the following claims and their equivalents, and shall not be restricted or limited by the foregoing description.

What is claimed is:

1. An image sensor comprising:
a substrate including a first surface;
a change storage portion disposed in the substrate;

a light-blocking pattern disposed on the first surface overlapping the charge storage portions; and
a low-refractive index pattern disposed on the light-blocking pattern,
wherein the low-refractive index pattern has one surface parallel to the first surface of the substrate, and another surface having a convex curvature.

2. The image sensor of claim 1, further comprising:
a planarization layer between the light-blocking pattern and the low-refractive index pattern,
wherein a refractive index of the planarization layer is greater than a refractive index of the low-refractive index pattern.

3. The image sensor of claim 2, further comprising:
an anti-reflection layer between the substrate and the light-blocking pattern; and
a color filter between the anti-reflection layer and the planarization layer,
wherein the color filter covers a top surface and a sidewall of the light-blocking pattern.

4. The image sensor of claim 1,
wherein the low-refractive index pattern has a lens shape,
wherein the low-refractive index pattern has a first width in a first direction parallel to the first surface of the substrate,
wherein the light-blocking pattern has a second width in the first direction, and
wherein the first width is greater than or equal to the second width.

5. The image sensor of claim 1,
wherein a sidewall of the low-refractive index pattern is inclined, and
wherein a cross-sectional area of the low-refractive index pattern, which is parallel to the first surface of the substrate, decreases as a distance from the light-blocking pattern increases.

6. The image sensor of claim 1,
wherein the low-refractive index pattern covers a top surface and both sidewalls of the light-blocking pattern, and
wherein the low-refractive index pattern is in contact with the top surface and both sidewalls of the light-blocking pattern.

7. The image sensor of claim 1, further comprising:
a photoelectric conversion portion disposed in the substrate adjacent to the charge storage portion;
a micro lens disposed on the first surface of the substrate overlapping the photoelectric conversion portion,
wherein the micro lens is spaced apart from the low-refractive index pattern in a direction perpendicular to the first surface of the substrate, and
wherein a refractive index of the low-refractive index pattern is less than a refractive index of the micro lens.

8. The image sensor of claim 7, wherein an edge of the micro lens overlaps with a portion of the low-refractive index pattern when viewed in a plan view.

9. The image sensor of claim 1, further comprising:
a photoelectric conversion portion disposed in the substrate adjacent to the charge storage portion;
a second surface of the substrate disposed opposite to the first surface of the substrate;
a storage gate disposed adjacent to the second surface of the substrate and configured to transfer charges generated from the photoelectric conversion portion to the charge storage portion; and
a deep device isolation portion disposed in the substrate between the photoelectric conversion portion and the charge storage portion,
wherein the deep device isolation portion is spaced apart from the second surface.

10. The image sensor of claim 9,
wherein the light-blocking pattern includes: a first portion overlapping the charge storage portion; and a second portion extending from the first portion onto the deep device isolation portion,
wherein each of the first and second portions of the light-blocking pattern has a width in a first direction parallel to the first surface of the substrate, and
wherein the width of the first portion of the light-blocking pattern is greater than the width of the second portion of the light-blocking pattern.

11. The image sensor of claim 1, further comprising:
a photoelectric conversion portion disposed in the substrate adjacent to the charge storage portion;
a conductive pattern electrically connecting the photoelectric conversion portion to the charge storage portion; and
a deep device isolation portion disposed between the photoelectric conversion portion and the charge storage portion in the substrate,
wherein the deep device isolation portion penetrates the substrate.

12. The image sensor of claim 11,
wherein the light-blocking pattern includes: a first portion overlapping the charge storage portion; and a second portion extending from the first portion onto the deep device isolation portion,
wherein each of the first and second portions of the light-blocking pattern has a width in a first direction parallel to the first surface of the substrate, and
wherein the width of the first portion of the light-blocking pattern is greater than the width of the second portion of the light-blocking pattern.

13. An image sensor comprising:
a pixel array including a plurality of pixels arranged in a row direction and a column direction, wherein each of the pixels comprises: a photoelectric conversion portion; and a change storage portion disposed from the photoelectric conversion portion in a diagonal direction with respect to the row direction or the column direction;
a micro lens on the photoelectric conversion portion; and
a low-refractive index pattern on the charge storage portion,
wherein the micro lens is spaced apart from the low-refractive index pattern in a vertical direction,
wherein an edge of the micro lens overlaps a portion of the low-refractive index pattern when viewed in a plan view,
wherein the low-refractive index pattern and the micro lens each have curvatures, and
wherein the curvature of the low-refractive index pattern is greater than the curvature of the micro lens.

14. The image sensor of claim 13, wherein a maximum diameter of the low-refractive index pattern is less than a maximum diameter of the micro lens.

15. The image sensor of claim 13, further comprising:
a light-blocking pattern between the low-refractive index pattern and the charge storage portion; and
a planarization layer between the low-refractive index pattern and the light-blocking pattern, wherein refractive indexes of the micro lens and the planarization layer are greater than a refractive index of the low-refractive index pattern, and wherein the refractive index of the micro lens is greater than or equal to the refractive index of the planarization layer.

16. The image sensor of claim 13, wherein the low-refractive index pattern includes a transparent photoresist material or a transparent thermosetting resin.

17. The image sensor of claim 13, further comprising:

a deep device isolation portion disposed on the photoelectric conversion portion, wherein the light-blocking pattern includes: a first portion overlapping the charge storage portion; and a second portion extending from the first portion onto the deep device isolation portion, wherein each of the first and second portions of the light-blocking pattern has a width in a first direction parallel to the first surface of the substrate, and wherein the width of the first portion of the light-blocking pattern is greater than the width of the second portion of the light-blocking pattern.

18. An image sensor comprising:

a substrate including a first surface and a second surface disposed opposite to each other;

a charge storage portion disposed in the substrate;

first, second, third and fourth photoelectric conversion portions arranged in a clockwise direction in the substrate to surround the charge storage portion;

a light-blocking pattern disposed on the first surface overlapping the charge storage portion;

color filters disposed on the first surface overlapping the charge storage portion and overlapping the first to fourth photoelectric conversion portions, the color filters covering the light-blocking pattern;

a low-refractive index pattern on the light-blocking pattern;

a planarization layer between the light-blocking pattern and the low-refractive index pattern; and micro lenses overlapping the first to fourth photoelectric conversion portions, respectively, wherein the first and third photoelectric conversion portions are spaced apart from each other with the charge storage portion interposed therebetween and are symmetrical with respect to the charge storage portion, wherein the second and fourth photoelectric conversion portions are spaced apart from each other with the charge storage portion interposed therebetween and are symmetrical with respect to the charge storage portion, wherein an edge of each of the micro lenses overlaps with a portion of the low-refractive index pattern when viewed in a plan view, wherein a refractive index of the low-refractive index pattern is less than a refractive index of the micro lenses, and wherein a refractive index of the planarization layer is greater than the refractive index of the low-refractive index pattern.

19. The image sensor of claim 18, further comprising:

a deep device isolation portion disposed between the first and second photoelectric conversion portions, wherein the light-blocking pattern includes: a first portion overlapping the charge storage portion; and a second portion extending from the first portion onto the deep device isolation portion, wherein each of the first and second portions of the light-blocking pattern has a width in a first direction parallel to the first surface of the substrate, and wherein the width of the first portion of the light-blocking pattern is greater than the width of the second portion of the light-blocking pattern.

20. The image sensor of claim 19, wherein the low-refractive index pattern has a lens shape, wherein the low-refractive index pattern has a first width in the first direction, wherein the light-blocking pattern has a second width in the first direction, and wherein the first width is greater than or equal to the second width.

* * * * *